(12) United States Patent
Chen et al.

(10) Patent No.: US 6,172,395 B1
(45) Date of Patent: Jan. 9, 2001

(54) METHOD OF MANUFACTURE OF SELF-ALIGNED FLOATING GATE, FLASH MEMORY CELL AND DEVICE MANUFACTURED THEREBY

(75) Inventors: Jong Chen, Taipei; Chrong Jung Lin, Hsin-Tein, both of (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/428,570

(22) Filed: Oct. 28, 1999

Related U.S. Application Data

(62) Division of application No. 08/938,569, filed on Sep. 26, 1997, now Pat. No. 6,013,551.

(51) Int. Cl.$^7$ ................................................ H01L 21/8247

(52) U.S. Cl. ........................... 257/315; 257/401; 257/346

(58) Field of Search ..................................... 257/315, 316, 257/317, 318, 319, 320, 321, 322, 323, 332, 401, 346; 438/257, 258, 259, 260, 261, 262, 263, 264, 265, 266, 267, 296

(56) References Cited

U.S. PATENT DOCUMENTS

| 5,087,584 | * | 2/1992 | Wada | 437/43 |
|---|---|---|---|---|
| 5,120,671 | | 6/1992 | Tang et al. | 437/43 |
| 5,125,067 | * | 6/1992 | Erdmun | 388/934 |
| 5,208,179 | * | 5/1993 | Okazawa | 438/52 |
| 5,217,920 | | 6/1993 | Mattox et al. | 437/67 |
| 5,229,312 | * | 7/1993 | Mukherjee | 437/43 |
| 5,376,573 | * | 12/1994 | Richart et al. | 437/48 |
| 5,495,441 | * | 2/1996 | Hong | 365/185.01 |
| 5,559,048 | * | 9/1996 | Inoue | 437/43 |
| 5,612,249 | * | 3/1997 | Sun et al. | 438/69 |
| 5,661,057 | * | 8/1997 | Fujiwara | 438/257 |
| 5,666,311 | * | 9/1997 | Mori | 438/257 |
| 5,679,591 | * | 10/1997 | Lin | 437/43 |
| 5,723,350 | * | 3/1998 | Fontana | 437/43 |
| 5,731,237 | * | 3/1998 | Sato | 438/257 |
| 5,874,760 | * | 2/1999 | Burns | 257/315 |
| 6,013,551 | * | 1/2000 | Chen | 438/264 |
| 6,025,626 | * | 2/2000 | Tempel | 257/315 |
| 6,040,210 | * | 3/2000 | Burns | 438/238 |
| 6,057,580 | * | 5/2000 | Watabe | 257/396 |
| 6,060,358 | * | 5/2000 | Bracchitta | 438/259 |
| 6,060,740 | * | 5/2000 | Shimizu | 257/314 |

FOREIGN PATENT DOCUMENTS

| 411026728A | * | 1/1999 | (JP) | 27/115 |
|---|---|---|---|---|
| 411103033A | * | 4/1999 | (JP) | 27/115 |

OTHER PUBLICATIONS

Aritome et al. "A 0.67$\mu$m$^2$ Self–Aligned Shallow Trench Isolation Cell (SA–STI Cell) for 3V–Only 256 MBIT Nand EEPROMS", IEDM 94–61 p. 3.6.1–3.6.4.

* cited by examiner

Primary Examiner—Mary Wilczewski
Assistant Examiner—David S Goodwin
(74) Attorney, Agent, or Firm—George O. Saile; Stephen B. Ackerman; Graham S. Jones, II

(57) ABSTRACT

A method of manufacture of self-aligned floating gate, flash memory device on a semiconductor substrate includes the following steps. Form a blanket silicon oxide layer over the substrate. Form a blanket floating gate conductor layer over the silicon oxide layer. Pattern the blanket silicon oxide layer, the floating gate conductor layer and the substrate in a patterning process with a single floating gate electrode mask forming floating gate electrodes from the floating gate conductor layer and the silicon oxide layer; and simultaneously form trenches in the substrate adjacent to the floating gate electrode and aligned with the floating gate electrodes thereby patterning the active region in the substrate. Form a blanket dielectric layer on the device filling the trenches and planarized with the top surface of the floating gate electrodes. Form an interconductor dielectric layer over the device including the floating gate electrodes. Form a control gate conductor over the interconductor dielectric layer.

10 Claims, 8 Drawing Sheets

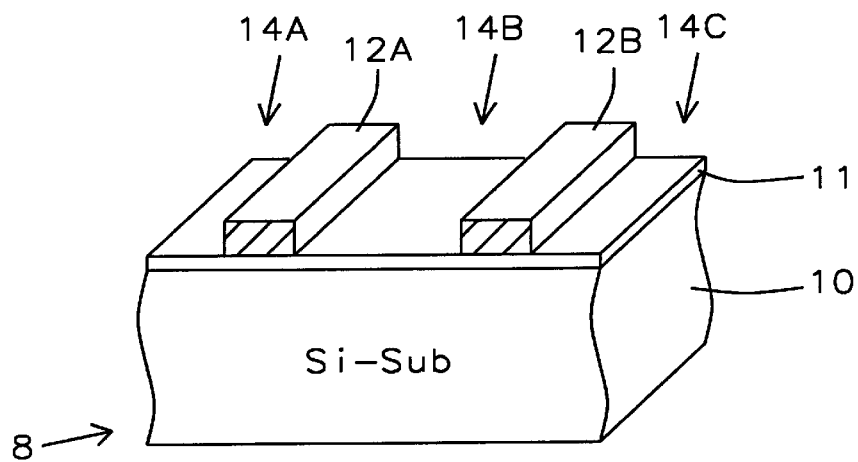
*FIG. 1A – Prior Art*
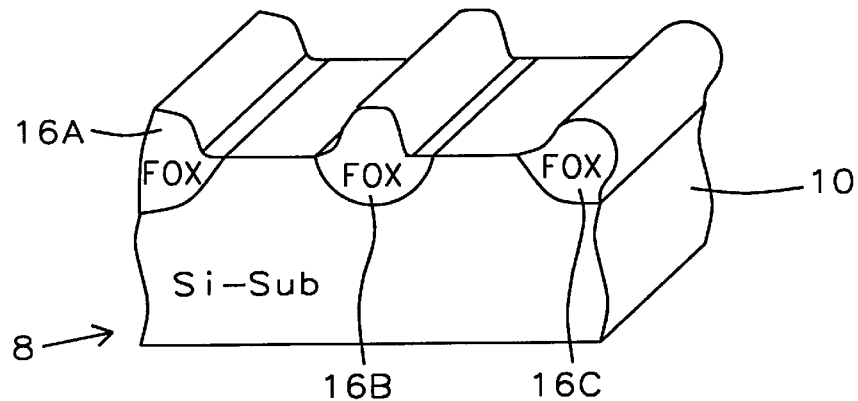
*FIG. 1B – Prior Art*
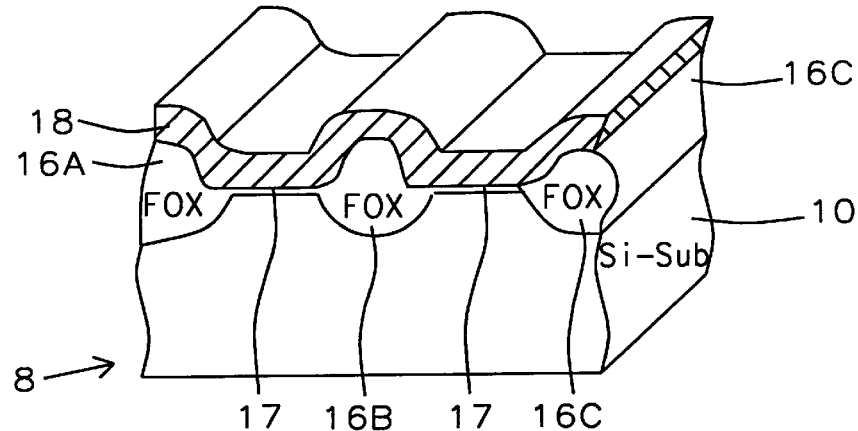
*FIG. 1C – Prior Art*

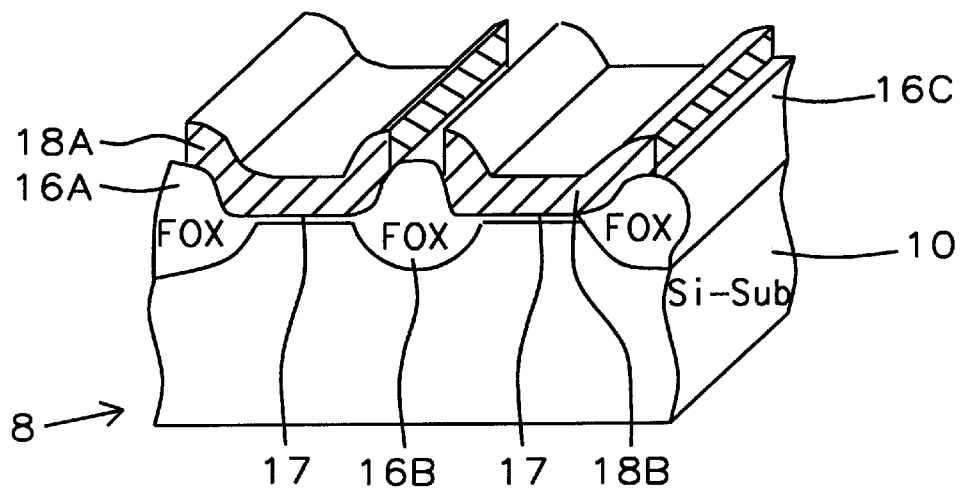
*FIG. 1D – Prior Art*
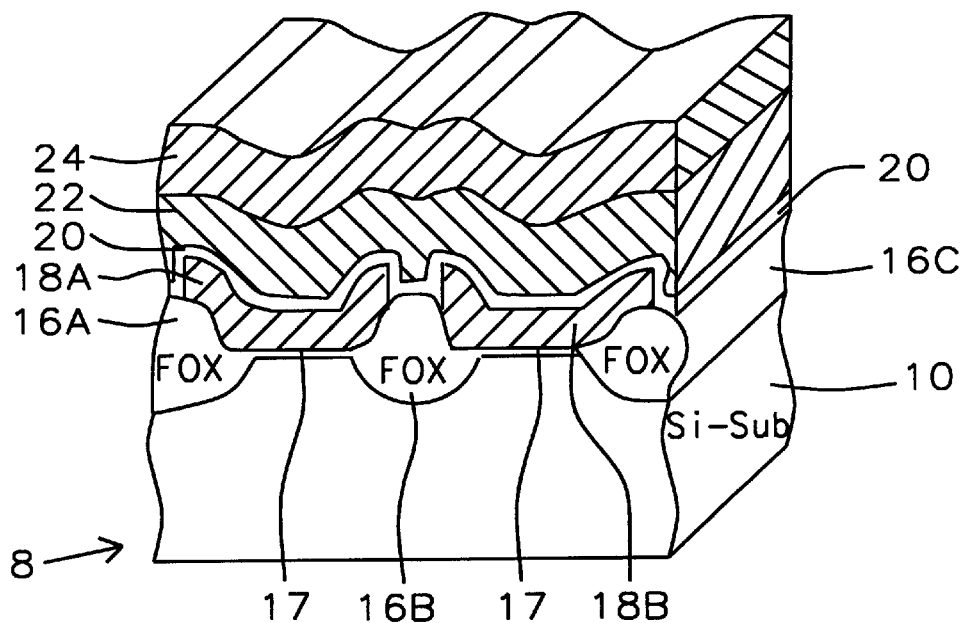
*FIG. 1E – Prior Art*

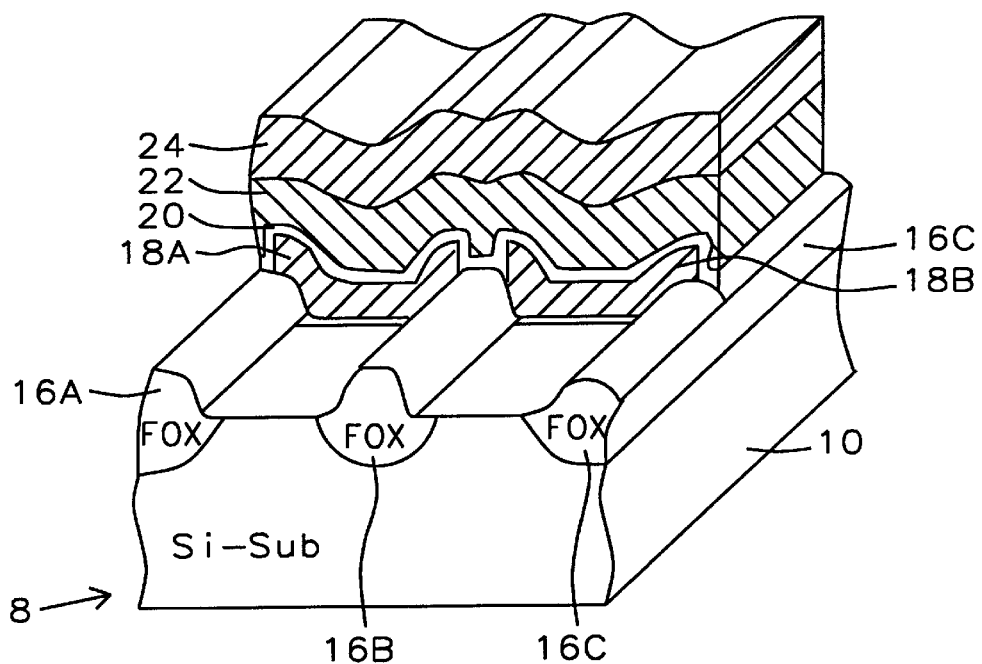
FIG. 1F – Prior Art
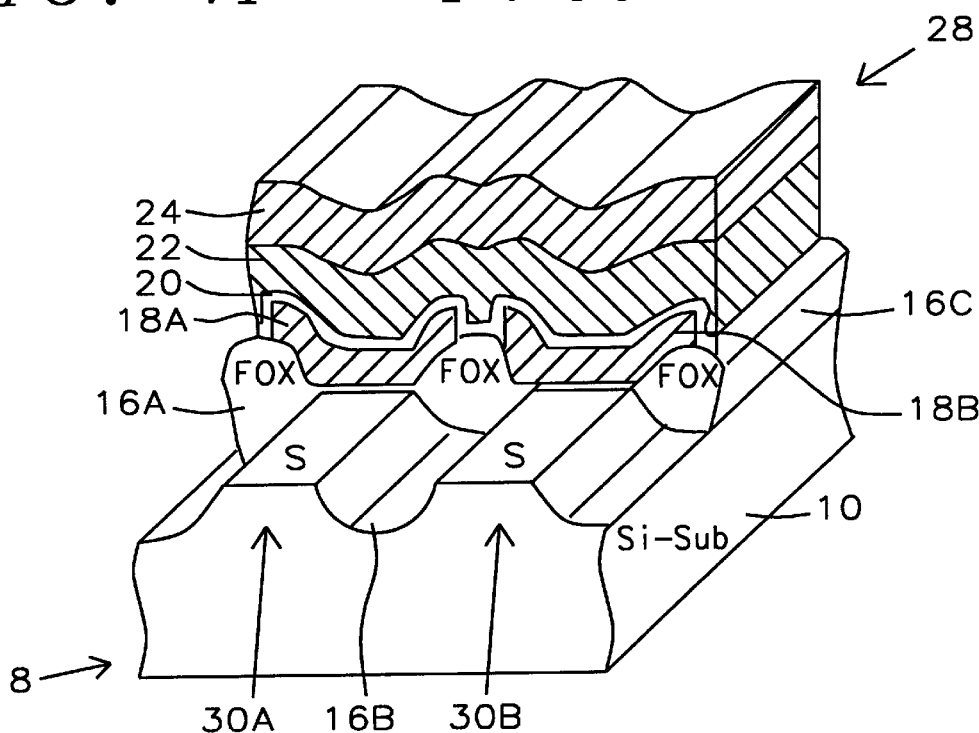
FIG. 1G – Prior Art

METHOD OF MANUFACTURE OF SELF-ALIGNED FLOATING GATE, FLASH MEMORY CELL AND DEVICE MANUFACTURED THEREBY

This is a division of patent application Ser. No. 08/938,569, filing date Sep. 26, 1997, Method Of Manufacture Of Self-Aligned Floating Gate, Flash Memory Cell And Device Manufactured Thereby, assigned to the same assignee as the present invention, now U.S. Pat. No. 6,013,551.

BACKGROUND OF THE INVENTION

1. Field of the Invention

This invention relates to methods of manufacture of semiconductor memory devices and the devices manufactured thereby and more particularly to flash memory devices and methods of manufacture thereof.

2. Description of Related Art

U.S. Pat. No. 5,612,249 of Sun et al. for "Post-Gate LOCOS" shows a process comprising: etching a gate oxide layer and a polysilicon layer to form gate structures for the FETs; surrounding the gate structures with an oxidation mask; etching areas of the top surface of the substrate which do not include the gate structures of the FETs such that the substrate is thicker underneath the gate structures for the FETs than it is at other areas of the substrate; and forming the LOCOS field oxide isolation regions by growing an oxide layer between the FETs. Sun patent '249 shows the concept of using isolation to self-align the S/D regions; but has the disadvantage that a complicated process is described requiring a series of steps to pattern the gates and form the trenches.

Aritome et al. for "A 0.67 $\mu m^2$ Self-Aligned Shallow Trench Isolation Cell (SA-STI Cell) for 3 V-only 256 Mbit NAND EEPROMS" IEDM 94-61 Pages 3.6.1–3.6.4 describes a floating gate that is "self-aligned with the STI."

U.S. Pat. No. 5,120,671 of Tang for a "Process for Self Aligning a Source with a Field Oxide Region and a Polysilicon Gate" and U.S. Pat. No. 5,376,573 of Richart et al. for a "Method of Making a Flash EPROM Device Utilizing a Single Masking Step for Etching and Implanting Source Regions within the EPROM Core and Redundancy Areas" shows a method for forming contact trenches and isolation trenches. The above Tang and Richart et al. references are based on LOCOS for isolation.

U.S. Pat. No. 5,217,920 of Mattox et al. shows a "Method of Forming Substrate Contact Trenches and Isolation Trenches Utilizing Anodization for Isolation" discloses features which differ from the present invention in that it provides for a buried contact.

FIGS. 1A–1G show processing steps for a prior art method for manufacturing a self-aligned floating gate flash memory cell. Some problems with the process are as follows:

1. Two separate photolithography masks are required to define active area and floating gate electrode, respectively.
2. Misalignment between these two photolithography masks limits the shrink scale for a Flash memory cell.
3. The LOCOS method limits the shrinkage of the width of the active area for Flash memory cells.

The process with the device 8 as seen in FIG. 1A begins with silicon substrate 10 with a pad silicon oxide layer 11 formed thereon. Above pad oxide layer 11 are formed silicon nitride masking strips 12A, 12B, which are employed during formation of the active region of the device employing the well known LOCOS (LOCal Oxidation of Silicon) process.

In FIG. 1B, the device of FIG. 1A is shown after a silicon nitride masking strips 12A and 12B are then stripped from the device 8 leaving a structure comprising a series of parallel FOX (Field OXide) region strips 16A, 16B and 16C formed on substrate 10.

As shown in FIG. 1C a tunnel oxide layer 17 has been formed on the exposed surface of the substrate 10 of FIG. 1B, aside from the FOX region strips 16A, 16B and 16C. A blanket doped polysilicon layer 18 is formed on device 8.

FIG. 1D shows the device of FIG. 1C after a floating gate mask has been formed to pattern the layer 18 into floating gate electrodes 18A and 18B bridging between FOX region strips 16A and 16B on the left and between and FOX region strips 16B and 16C on the right. There is the potential of misalignment with the two masking steps required to achieve the results shown in FIGS. 1B and 1D.

In FIG. 1E the device of FIG. 1D is shown after an interpolysilicon dielectric, ONO, layer 20 is grown. Then as shown a second polysilicon layer 22 is formed over the ONO layer 120 and a tungsten silicide layer 24 formed over the second polysilicon layer 22. Layer 22 and layer 24 are to be patterned into control gate electrodes stacks 22/24 on a step-by-step basis.

FIG. 1F shows the device of FIG. 1E after a Stacked Gate Etch (SGE) mask (not shown) has been used to etch away exposed portions of layers on the periphery of device 8 after the silicide layer 24, polysilicon 22, ONO layer 20 and first polysilicon layer 18A, 18B through that mask yielding the structure seen in FIG. 1F with the surface of the FOX regions 16A, 16B and 16C exposed beyond the remaining gate electrode stack 28.

FIG. 1G shows the device of FIG. 1F after the self-aligning source mask has been used to etch away the exposed portions of the FOX regions 16A, 16B and 16C to expose the surfaces of the substrate to form S (source) regions 30A and 30B adjacent to the floating gates 18A and 18B. The drain regions (not seen) are formed on the opposite side of the gate electrode stack 28 from the source regions 30A and 30B.

SUMMARY OF THE INVENTION

Problems solved and the improvements obtained by this invention include as follows:

1. Only a single masking layer is required instead of two conventional layers to define an active area and a floating gate electrode.
2. The problems associated with a misalignment between the two masks usually employed for defining the active area and the floating gate electrode is completely avoided and the space between the active areas of two adjacent cell can be scaled down, easily.
3. Because of the planarization of device topography, the following etch steps, for example: stacked gate electrode etch and contact hole etch, become much easier.
4. Application of trenched source line implant can save the space between stacked gate electrode.

In accordance with this invention, a method of manufacture of self-aligned floating gate, flash memory device on a semiconductor substrate comprises the steps which follow.

Make a threshold voltage adjustment implant. Form a blanket tunnel oxide layer over the substrate. Form a blanket floating gate doped polysilicon layer over the silicon oxide layer. Patterning the blanket silicon oxide layer, the floating gate, polysilicon layer and the substrate in a patterning process with a single mask forming a floating gate electrode from the floating gate polysilicon layer and the tunnel oxide layer and simultaneously forming trenches in the substrate adjacent to the floating gate electrode and aligned therewith. Form a trench dielectric structure on the surface of the device by the following steps. Form a blanket, thin thermal oxide dielectric layer on the device including the trenches and covering the floating gate conductor layer. Form a blanket, thin PECVD silicon oxide dielectric layer on the device including the trenches and covering the thin thermal oxide dielectric layer. Then form a blanket, SACVD silicon oxide dielectric layer on the device filling the trenches and covering the device with a thick film of silicon oxide material. Planarize the trench dielectric structure with the surface of the floating gate conductor by a CMP processing step. Form an interconductor ONO dielectric layer over the device. Form a control gate conductor over the interconductor dielectric layer.

Preferably, the blanket silicon oxide layer comprises a tunnel oxide layer with a thickness from about 70 Å to about 150 Å; and the floating gate conductor layer comprises a doped polysilicon layer having a thickness from about 500 Å to about 2,000 Å.

Preferably, the blanket trench dielectric structure on the device comprises first a thin, thermal, silicon oxide layer with a thickness from about 200 Å to about 500 Å grown by a conventional thermal oxidation process on the exposed surfaces at the bases of trench structures. Second a PECVD silicon oxide layer having a thickness from about 200 Å to about 2,000 Å is coated on the surfaces of the thermal silicon oxide layer, and third a SACVD silicon oxide layer having a thickness from about 5,000 Å to about 20,000 Å filling up the trenches and extending well above the surface of the device.

Preferably the blanket trench dielectric structure is planarized by a step selected from the group consisting of etching and chemical mechanical polishing.

In accordance with another aspect of this invention, a self-aligned floating gate, flash memory device comprises semiconductor substrate with a tunnel oxide layer over the substrate and a floating gate conductor over the tunnel oxide layer including the following. Trenches are formed in the surface of the substrate with an active region formed in the surface of the substrate. The tunnel oxide layer, the trenches in the substrate, and the active region in the substrate are self-aligned with the floating gate electrode. A trench dielectric structure is planarized with the floating gate conductor on the device filling the trenches except between source/drain regions formed in the substrate. An interconductor dielectric layer overlies the floating gate conductor. A control gate conductor over the interconductor dielectric layer. The control gate conductor, the floating gate conductor, and the silicon oxide layer form a self-aligned gate electrode stack. The trenches are empty of the trench dielectric layer adjacent to the gate electrode stack. The source/drain regions are formed in the substrate adjacent to the gate electrode stack, the source regions and the drain regions being separated by the trenches.

Preferably, the blanket silicon oxide layer comprises a tunnel oxide layer with a thickness from about 70 Å to about 150 Å. The floating gate conductor layer comprises a doped polysilicon layer having a thickness from about 500 Å to about 2,000 Å. The blanket trench dielectric structure on the device comprises a thin, thermal, silicon oxide layer with a thickness from about 200 Å to about 500 Å formed on the exposed surfaces at the bases of trench structures, a PECVD silicon oxide layer having a thickness from about 200 Å to about 2,000 Å coated on the surfaces of the thermal silicon oxide layer, and a SACVD silicon oxide layer filling up the trenches.

Preferably, the interconductor dielectric layer over the floating gate conductor comprises ONO having a thickness from about 100 Å to about 250 Å. A control gate conductor over the interconductor dielectric layer comprising a second polysilicon layer having a thickness from about 1,000 Å to about 3,000 Å formed over the ONO layer and a tungsten silicide layer having a thickness from about 1,000 Å to about 3,000 Å is formed over the second polysilicon layer.

BRIEF DESCRIPTION OF THE DRAWINGS

The foregoing and other aspects and advantages of this invention are explained and described below with reference to the accompanying drawings, in which:

FIGS. 1A–1G show processing steps for a prior art method for manufacturing a self-aligned floating gate flash memory cell.

DESCRIPTION OF THE PREFERRED EMBODIMENT

Figure 2A:
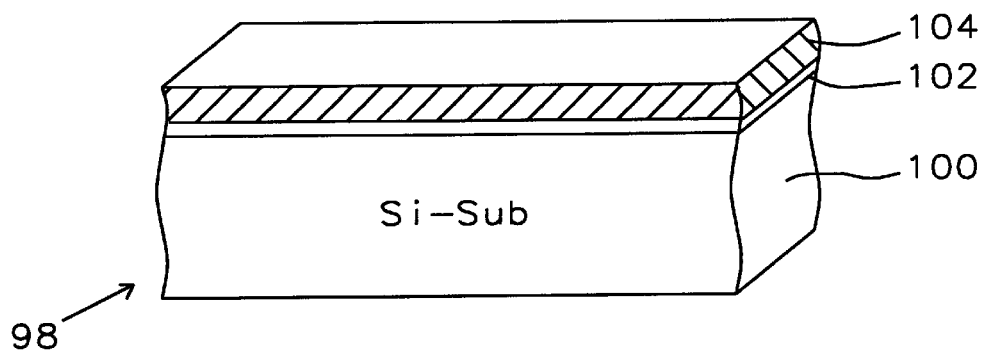
FIGS. 2A–2I show the processing steps for a method of manufacture of a self-aligned floating gate flash memory cell device in accordance with this invention.
Figure 2B:
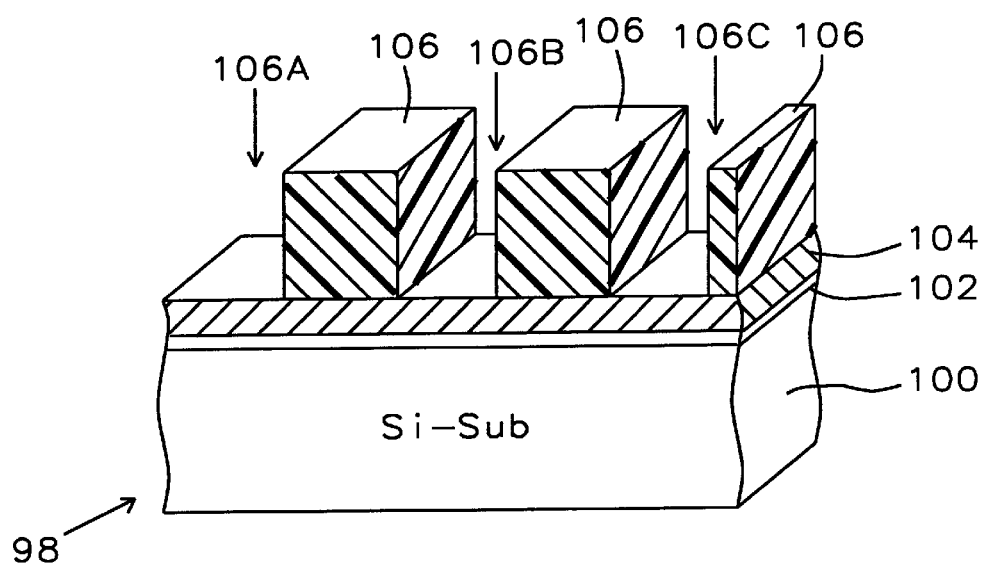
Figure 2C:
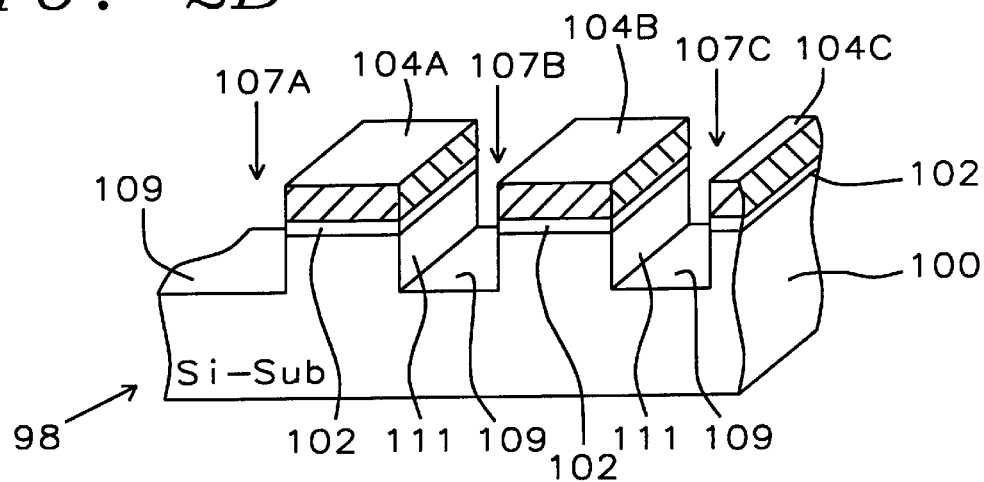
Figure 2D:
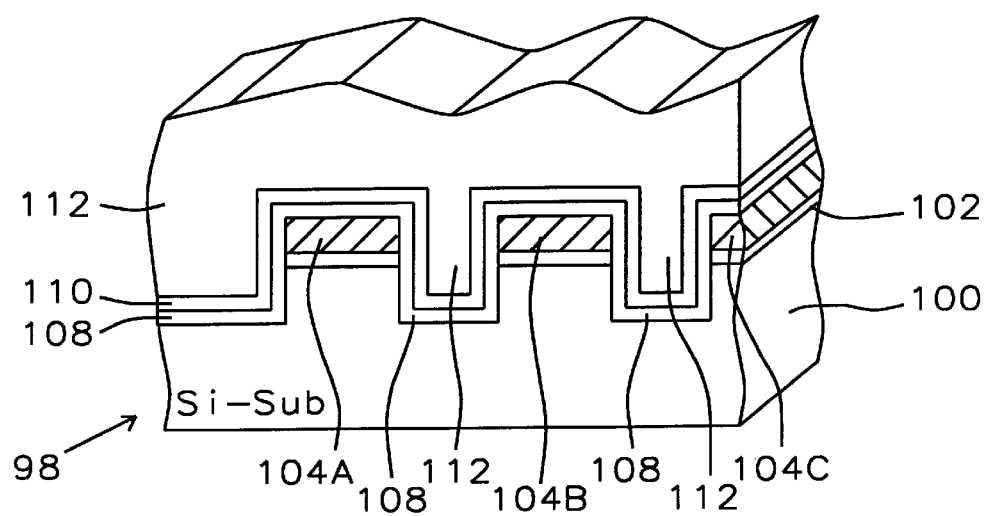
Figure 2E:
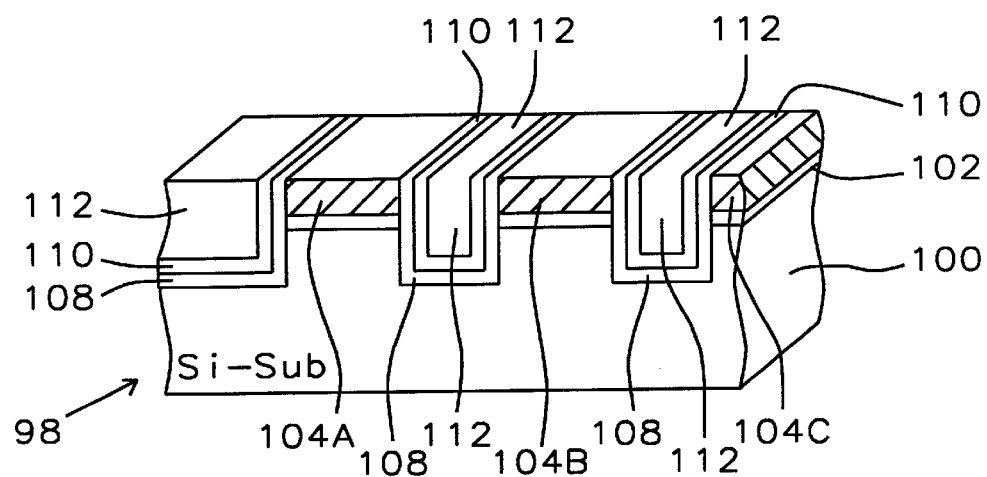
Figure 2F:
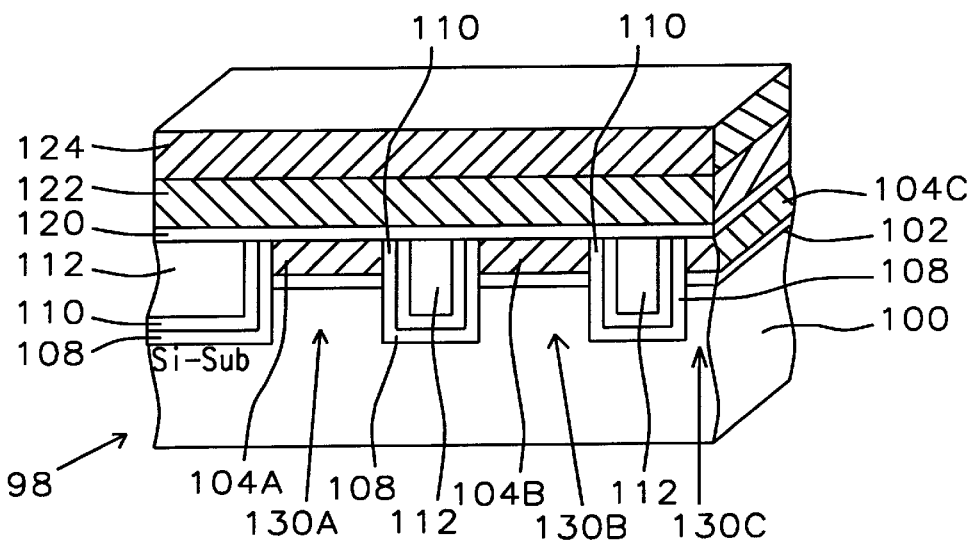
Figure 2G:
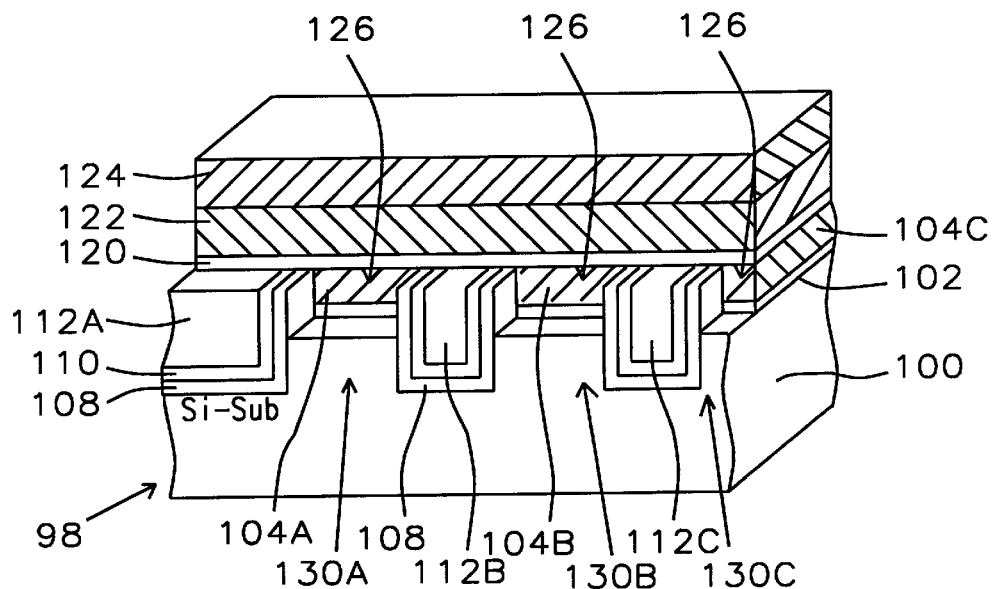
Figure 2H:
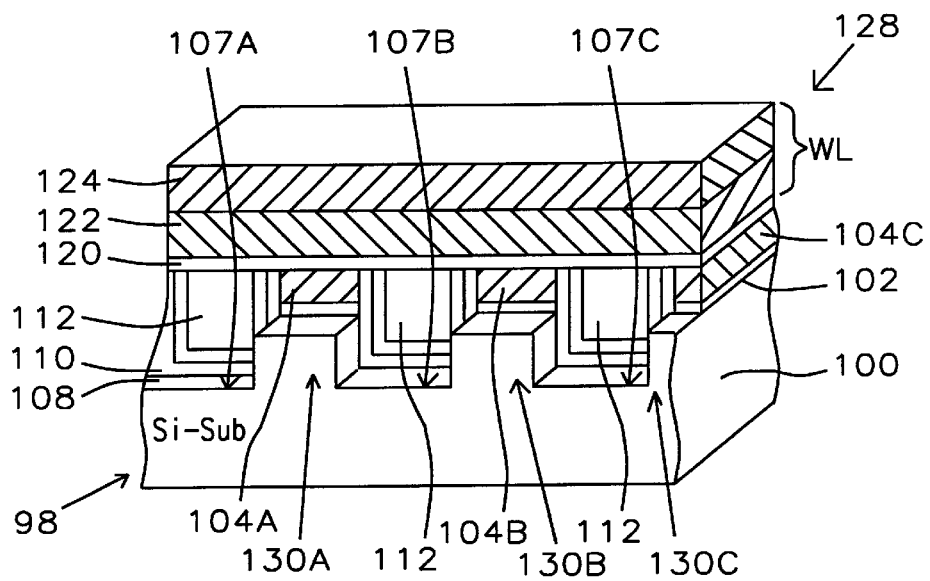
Figure 2I:
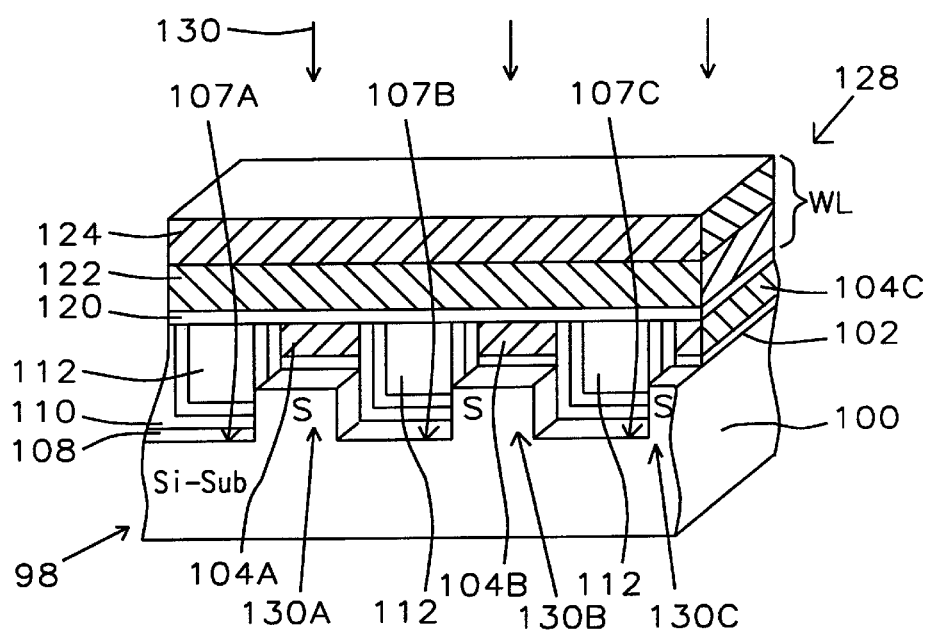

Details of an embodiment of the process and the device of this invention are illustrated in FIGS. 2A–2I, which show the processing steps for a method of manufacture of a self-aligned floating gate flash memory cell device 98 in accordance with this invention, and resulting in the device in FIG. 2I.

FIG. 2A shows a fragment of the flash memory device 98 in an early stage of manufacture after a threshold voltage ($V_t$) adjustment implant step followed by formation of a tunnel oxide layer 102 which was grown on the surface of the P- doped silicon (Si) semiconductor substrate 100.

Thus there was a threshold voltage ($V_t$) adjustment implant step at an early stage of the process before the tunnel oxide layer 102 was grown. The threshold voltage ($V_t$) adjustment implant step is employed when the device has silicon substrate 100 covered with a layer of screen oxide, as will be well understood by those skilled in the art. This preliminary step differs from the LOCOS process of the prior art in that the threshold voltage ($V_t$) adjustment implant step is performed in that LOCOS structures are grown before the tunnel oxide is grown, unlike the present invention.

In accordance with the process of this invention, in an early step, the tunnel oxide layer 102 having a thickness from about 70 Å to about 150 Å is grown by a thermal oxidation process as a blanket layer covering the surface of P- doped silicon (Si) semiconductor substrate 100 of a cell of device 98. A doped, first polysilicon layer 104, having a thickness from about 500 Å to about 2,000 Å, is deposited as a blanket layer covering the surface of the tunnel oxide layer 102.

Then, as shown in FIG. 2B, the device 98 of FIG. 2A is shown after a Self-Aligned Floating gate (SAF) mask 106 has been formed to be used in etching the first polysilicon layer 104 and tunnel oxide layer 102 through windows 106A, 106B and 106C in SAF mask 106 to form the floating gates 104A, 104B and 104C of the device 98.

FIG. 2C shows the device 98 of FIG. 2B after completion of the step of etching through windows 106A, 106B and 106C in mask 106 down through first polysilicon layer 104 and tunnel oxide layer 102 down into substrate 100 to define therein a set of trench structures 107A, 107B and 107C with a set of bases 109 and sidewalls 111 formed in the silicon (Si) substrate 100. The etching produced is patterned by the windows 106A, 106B and 106C in the SAF mask 106. The resulting set of floating gate electrodes 104A, 104B and 104C are separated by the trench structures 107A, 107B and 107C.

The process of formation of the above trench structures 107A, 107B and 107C defines the active area and floating gate electrodes 104A, 104B and 104C simultaneously by using the trench method with only one mask after the floating gate electrode layer 104 has been deposited. This process provides self-alignment between the active areas and floating gate electrodes.

The etching of the substrate and the previous threshold voltage ($V_t$) adjustment implant step form the active areas.

In FIG. 2D, the device 98 of FIG. 2C is shown after growth of a trench dielectric structure which is composed of several isolation oxide layers 108, 110 and 112 which were grown thereon filling the trench sites.

A step in forming the trench dielectric structure is to form a thin, thermal, silicon oxide layer 108 having a thickness from about 200 Å to about 500 Å grown by a conventional thermal oxidation process on the exposed surfaces at the bases 109 of trench structures 107A, 107B in trenched silicon (Si) substrate 100, as well as on the sidewalls 111 in FIG. 2C of trench structures 107A, 107B and on the remaining top and sidewall surfaces of polysilicon floating gate electrodes 104A, 104B and 104C and the sidewalls of tunnel oxide layer 102.

The next step in forming the trench dielectric structure is to form a PECVD silicon oxide layer 110 having a thickness from about 200 Å to about 2,000 Å is coated on the surfaces of the thermal silicon oxide layer 108.

A further step in forming the trench dielectric structure is to form a SACVD silicon oxide layer 112 having a thickness of about 10,000 Å, within the range from about 5,000 Å to about 20,000 Å, is deposited filling up the trenches 107A, 107B and extending well above the surface of the previous layers.

In FIG. 2E, the device 98 of FIG. 2D is shown after a planarized flat surface has been provided on the device 98 in the following step of forming the trench dielectric structure on device 98. The top surface of device 98 has been planarized during a CMP (Chemical Mechanical Polishing) or etching process. The SACVD silicon oxide layer 112 is flattened by a CMP process or a process of etching back the SACVD silicon oxide layer 112 from the top surfaces of the polysilicon floating gate electrodes 104A, 104B and 104C thereby completing the formation of the trench dielectric structure of layers 108, 110 and 112.

In FIG. 2F, an interpolysilicon dielectric, ONO (silicon Oxide/silicon Nitride/silicon Oxide) layer 120 is grown having a thickness from about 100 Å to about 250 Å. Then, a second polysilicon layer 122 is shown having a thickness from about 1,000 Å to about 3,000 Å which is formed over the ONO layer 120. A tungsten silicide layer 124 having a thickness from about 1,000 Å to about 3,000 Å is formed over the second polysilicon layer 122. Layer 122 and layer 124 are to be patterned into control gate electrodes stacks 122/124 of flash memory MOSFET devices on a step-by-step basis.

Then a Stacked Gate Etch (SGE) mask (not shown) is used to remove exposed portions of layers of the gate electrode stack 128 on the periphery of device 98, which after etching away the silicide layer 124, polysilicon 122, ONO layer 120 and first polysilicon layer 104A, 104B, 104C through that mask yields the structure seen in FIG. 2G providing the word line WL for the flash memory MOSFET transistors of device 98. The etching process used is plasma etching with appropriate gases selected from those well known to those skilled in the art for each layer of the gate electrode stack 128. The silicon oxide layers 108, 110 and 112 are not etched away because as the polysilicon layer 104A, 104B, 104C which is the bottom layer of the stack because an etchant which is highly selective between polysilicon and silicon oxide is employed, as will be well understood by those skilled in the art.

Figure 3A:
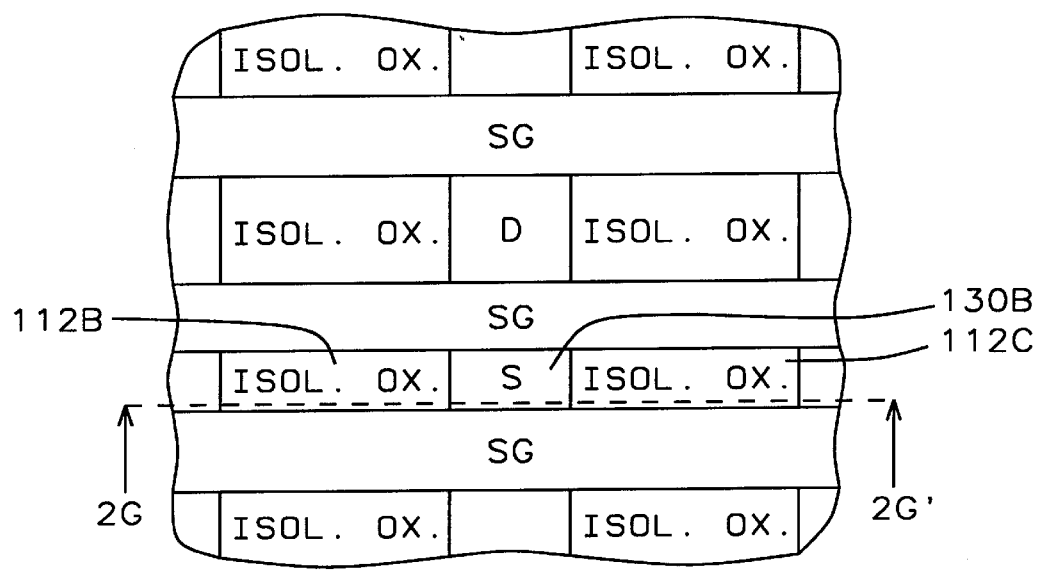
FIG. 3A shows a plan view of a flash memory device array in accordance with this invention with a set of isolation oxide regions in rows alternating with stacked gate rows.

The pattern of the device 98 after etching is seen in a plan view in FIG. 3A.

A polysilicon 2 mask (not shown) is used to define the control gate electrodes for peripheral devices in a separate step.

Figure 3B:
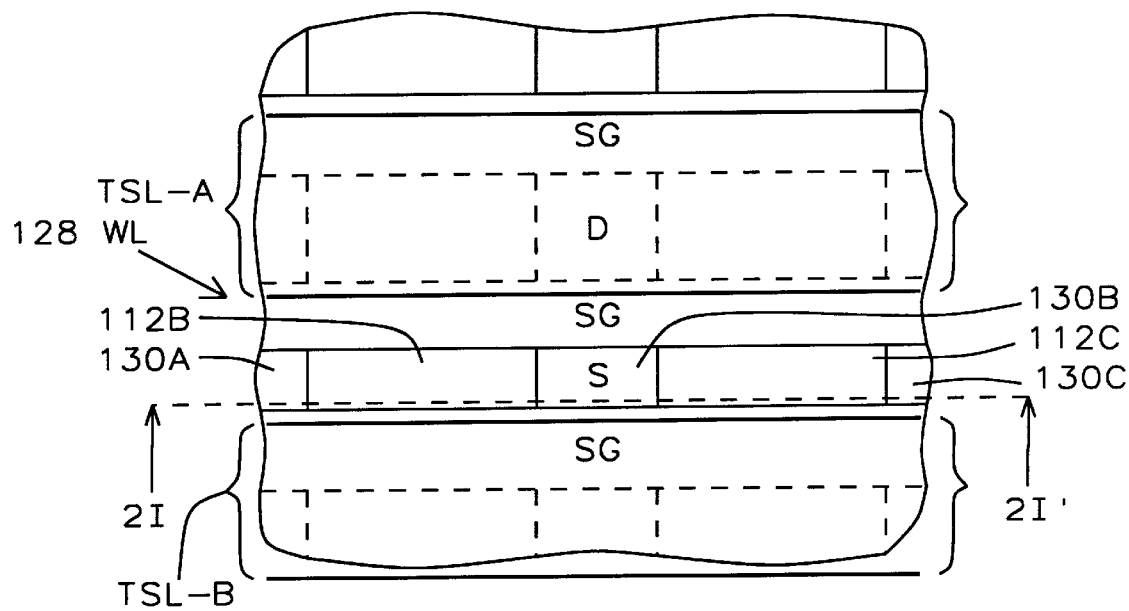
FIG. 3B shows the view of FIG. 3A with the trenched source line mask TSL superimposed thereon.

Referring to FIG. 2H, the device of FIG. 2G is shown after etching through a trenched source line (TSL) mask (shown in a plan view in FIG. 3B) to remove the trench dielectric structure of the thermal silicon oxide layer 108, PECVD silicon oxide layer 110, and SACVD silicon oxide layer 112 inside the trenched site located in the source of memory cell as shown in FIG. 3B, leaving the remainder of silicon oxide layers 108, 110 and 112 beyond the edge of the mask. Implantation for trenched source line is also aligned by this TSL mask as shown in FIG. 3B.

Referring to FIG. 2I, the device of FIG. 2H is shown after tungsten silicide annealing and ion implantation steps of N+/P+ S/D ions have been implanted as illustrated by ions 130 which are implanted through the appropriate conventional masks to form the "S" source region mesas 130A, 130B and 130C in the mesas between the trenches 107A, 107B and 107C as well as in those trenches.

The formation of doped regions at the base of the empty trenches between the source region mesas 130A, 130B and 130C where the trench dielectric has been removed in those inter-source spaces. Thus the source regions (mesas) 130A, 130B and 130C and trenches 107A, 107B, and 107C combine together to form a source line.

Such doped regions formed at the base of the empty trenches provide electrical connections, because the concentration of the source/drain (S/D) implant is very high, the resistance of the so-called source line is small.

As the cell structure is completed as shown in FIG. 2G, a trench source line mask is employed to cover the drain regions and part of the stack gate 128, but to expose the entire source line area. The the isolation oxide 112 can be removed and the source line can be implanted separately if necessary simply through this mask.

Then a coating forming ILD layer is applied to the device 98 followed by steps forming contact holes and contact implants which are defined by a contact mask. After tungsten plugs are deposited and etched back, a metallization layer is formed as a coating on the device which is defined by a metal layer mask.

Then IMD, VIA and METAL masks are used to conduct the back end process.

FIG. 3A shows a plan view of a flash memory device array with a set of isolation oxide regions (Isol. OX.) in rows alternating with stacked gate rows. The drain region D and source region S are in separate Isol. OX. rows on opposite sides of one of the stacked gates SG, with the drain region D and source region S sandwiched between the isolation oxide regions Isol. OX. on either side of them in the rows.

FIG. 3B shows the view of FIG. 3A with the trenched source line mask TSL superimposed thereon.

SUMMARY

In the process of this invention, a tunnel oxide layer is grown on a silicon substrate first followed by and deposition of first polysilicon layer to form a floating gate electrode. Then a Self-Aligned Floating-Gate (SAF) mask is employed to define the floating gate and tunnel oxide simultaneously. The trench structure on the Si substrate is created by this SAF mask. A thin layer of thermal silicon oxide is grown by traditional thermal oxidation on the surface of trenched silicon and the first polysilicon layer.

A layer of PECVD silicon oxide is coated on the thermal oxide. A SACVD silicon oxide layer fills up the trenched site, and a CMP or Etch Back process is employed to level the SACVD silicon oxide layer on the polysilicon and planarize the very top surface of the device. An ONO dielectric layer is grown, and an ONO mask is used to remove ONO and polysilicon layers only on the periphery of the device. Later, polysilicon and tungsten silicide used as a control gate are stacked on step-by-step. A Stacked Gate Etch (SGE) mask is used to define stacked gate for memory cell. A polysilicon 2 mask is used to define the control gate for the peripheral devices separately. A Trenched Source Line (TSL) mask is employed to remove the oxide inside the trenched site located in the source regions of the memory cell. Implantation for a trenched source line is also aligned by this TSL mask. After tungsten silicide annealing, N+/P+ S/D implants are conducted with the relative masks. As the ILD is coated, contact holes and contact implants are defined by a contact mask. After a tungsten plug is deposited and etched back, a metallization layer is coated and defined by a metallization layer mask. Then IMD, VIA and METAL masks are used to conduct the back end of the process.

While this invention has been described in terms of the above specific embodiment(s), those skilled in the art will recognize that the invention can be practiced with modifications within the spirit and scope of the appended claims, i.e. that changes can be made in form and detail, without departing from the spirit and scope of the invention. Accordingly all such changes come within the purview of the present invention and the invention encompasses the subject matter of the claims which follow.

Having thus described the invention, what is claimed as new and desirable to be secured by Letters Patent is as follows:

1. A self-aligned floating gate, flash memory device on the surface of a semiconductor substrate doped with a first type of dopant comprising:

a silicon oxide layer over said surface of said substrate, a floating gate electrode formed over said silicon oxide layer, trenches formed in the surface of said substrate, an active region formed in the surface of said substrate, an interconductor dielectric layer formed over said floating gate electrode, a control gate conductor formed over said interconductor dielectric layer, said silicon oxide layer over said surface of said substrate, said floating gate electrode said trenches formed in the surface of said substrate, said interconductor dielectric layer and said control gate conductor forming a self-aligned gate electrode stack, a row of source regions doped with an opposite type of dopant from said substrate with said trenches therebetween on the one side of said gate electrode stack, a row of drain regions doped with an opposite type of dopant from said substrate with said trenches therebetween on the opposite side of said gate electrode stack, said silicon oxide layer, said trenches in said substrate, and said active region in said substrate being self-aligned with said floating gate electrode, and a trench dielectric structure planarized with said floating gate electrode filling said trenches aside from said source/drain regions.

2. A device in accordance with claim 1 wherein said silicon oxide layer comprises a tunnel oxide layer with a thickness from about 70 Å to about 150 Å.

3. A device in accordance with claim 1 wherein:

said silicon oxide layer comprises a tunnel oxide layer with a thickness from about 70 Å to about 150 Å, said floating gate electrode comprises a doped polysilicon layer having a thickness from about 500 Å to about 2,000 Å.

4. A device in accordance with claim 1 wherein:

said silicon oxide layer comprises a tunnel oxide layer with a thickness from about 70 Å to about 150 Å, said floating electrode comprises a doped polysilicon layer having a thickness from about 500 Å to about 2,000 Å, and said trench dielectric structure on said device comprises first a thin, thermal, silicon oxide layer with a thickness from about 200 Å to about 500 Å formed on the exposed surfaces at the bases of trench structures, second a PECVD silicon oxide layer having a thickness from about 200 Å to about 2,000 Å coated on the surfaces of the thermal silicon oxide layer, and third a SACVD silicon oxide layer filling up the trenches.

5. A self-aligned floating gate, flash memory device on a semiconductor substrate with a tunnel oxide layer over said substrate and a floating gate conductor over said tunnel oxide layer, comprising:

trenches formed in the surface of said substrate, an active region formed in the surface of said substrate, said tunnel oxide layer, said trenches in said substrate, and said active region in said substrate being self-aligned with said floating gate electrode, a trench dielectric structure planarized with said floating gate conductor on said device filling said trenches except between source/drain regions formed in said substrate, an interconductor dielectric layer over said floating gate conductor, and a control gate conductor over said interconductor dielectric layer, said control gate conductor, said floating gate conductor, and said silicon oxide layer forming a self-aligned gate electrode stack, said trenches being empty of said trench dielectric layer adjacent to said gate electrode stack, said source/drain regions being formed in said substrate adjacent to said gate electrode stack, said source regions and said drain regions being separated by said trenches.

6. A device in accordance with claim 5 wherein said tunnel oxide layer has a thickness from about 70 Å to about 150 Å.

7. A device in accordance with claim 5 wherein:

said tunnel oxide layer has a thickness from about 70 Å to about 150 Å, said floating gate conductor layer comprises a doped polysilicon layer having a thickness from about 500 Å to about 2,000 Å.

8. A device in accordance with claim 5 wherein:

said blanket silicon oxide layer comprises a tunnel oxide layer with a thickness from about 70 Å to about 150 Å, said floating gate conductor layer comprises a doped polysilicon layer having a thickness from about 500 Å to about 2,000 Å, and said blanket trench dielectric structure on said device comprises a thin, thermal, silicon oxide layer with a thickness from about 200 Å to about 500 Å formed on the exposed surfaces at the bases of trench structures, a PECVD silicon oxide layer having a thickness from about 200 Å to about 2,000 Å coated on the surfaces of the thermal silicon oxide layer, and a SACVD silicon oxide layer filling up said trenches.

9. A device in accordance with claim 5 wherein:

said floating gate conductor comprises a doped polysilicon layer having a thickness from about 500 Å to about 2,000 Å, said interconductor dielectric layer over said floating gate conductor comprises ONO, a control gate conductor over said interconductor dielectric layer comprising a second polysilicon layer formed over said ONO layer and a tungsten silicide layer formed over said second polysilicon layer.

10. A device in accordance with claim 7 wherein:

said floating gate conductor comprises a doped polysilicon layer having a thickness from about 500 Å to about 2,000 Å, said interconductor dielectric layer over said floating gate conductor comprises ONO having a thickness from about 100 Å to about 250 Å, a control gate conductor over said interconductor dielectric layer comprising a second polysilicon layer having a thickness from about 1,000 Å to about 3,000 Å formed over said ONO layer and a tungsten silicide layer having a thickness from about 1,000 Å to about 3,000 Å is formed over said second polysilicon layer.

* * * * *